Sept. 28, 1965 G. N. KAMBOURIS 3,209,279

SEMICONDUCTOR NOISE SOURCE

Filed Feb. 9, 1962 3 Sheets-Sheet 1

INVENTOR

GEORGE N. KAMBOURIS

BY S. J. Rotondi, A. J. Dupont & J. P. Edgerton

ATTORNEYS

Sept. 28, 1965 G. N. KAMBOURIS 3,209,279

SEMICONDUCTOR NOISE SOURCE

Filed Feb. 9, 1962 3 Sheets-Sheet 2

INVENTOR
GEORGE N. KAMBOURIS

BY S. J. Rotondi, A. J. Dupont & J. P. Edgerton

ATTORNEYS

SEMICONDUCTOR NOISE SOURCE

Filed Feb. 9, 1962 3 Sheets-Sheet 3

INVENTOR
GEORGE N. KAMBOURIS

BY S. J. Rotondi, A. J. Dupont & J. P. Edgerton

ATTORNEYS

United States Patent Office 3,209,279

Patented Sept. 28, 1965

3,209,279
SEMICONDUCTOR NOISE SOURCE

George N. Kambouris, Bethesda, Md., assignor to the United States of America as represented by the Secretary of the Army Filed Feb. 9, 1962, Ser. No. 172,360
1 Claim. (Cl. 331—78)
(Granted under Title 35, U.S. Code (1952), sec. 266)

The invention described herein may be manufactured and used by or for the Government for governmental purposes without the payment to me of any royalty thereon.

This invention relates to generators of random electrical noise and more particularly to random noise generators having a relatively large output voltage. It has heretofore been the practice in the production of random noise signals to utilize the noise outputs of various types of highly sensitive devices such as Geiger counters, photoconductive units, or gas discharge tubes. The outputs of these devices are then generally amplified in one or several amplification stages in order to produce an output having a useful noise voltage level. These devices generally require a large number of components and a rather large power supply.

It is, therefore, an object of this invention to provide a random noise generator having great reliability, simplicity, and low power requirements.

It is a further object of this invention to provide a noise generator having a large output voltage.

Another object of this invention is to provide a noise generator adapted to provide a group of noise pulses having a controlled repetition rate.

In a preferred embodiment of the invention, a diode having a reverse breakdown characteristic, known as an "avalanche" diode, and which is further characterized by being noisy in the region immediately following its breakdown point, is placed between the base and collector of a transistor so as to permit the current amplification properties of a grounded emitter transistor to amplify the noise voltage to a useful level. The transistor load resistance and supply voltage are adjusted so that the circuit will operate in the region where the diode is in its noisy state.

The specific nature of the invention, as well as other objects, uses and advantages thereof, will clearly appear from the following description and from the accompanying drawing, in which:

FIG. 1*a* is a schematic diagram of one preferred embodiment of the present invention.

FIG. 1*b* is an equivalent circuit diagram of the circuit of FIG. 1*a*.

FIGS. 2*a*, 2*b* and 2*c* are graphs illustrating the operation of the device of FIG. 1*a*.

Figure 4:
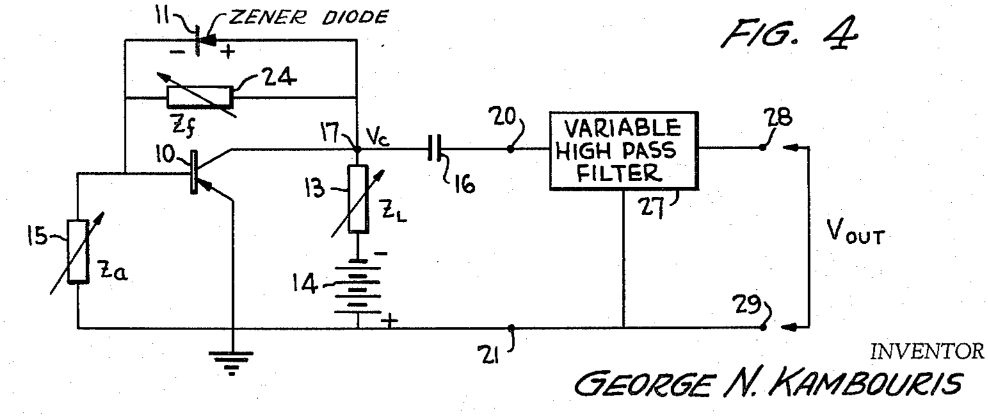
FIG. 4 is a schematic diagram of a transistor oscillator adapted to produce a pulse noise output.
Figure 5A:
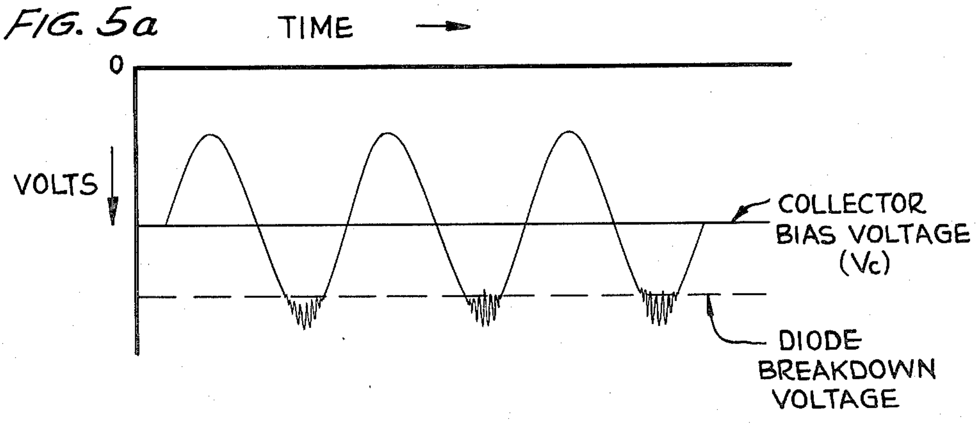
Figure 5B:
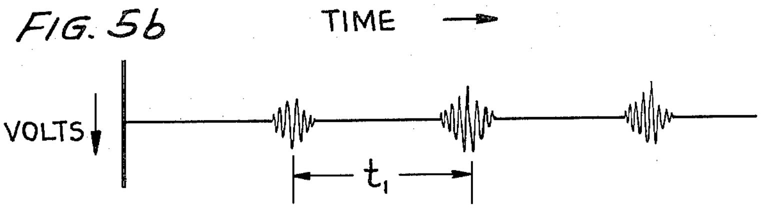

FIGS. 5*a* and 5*b* are curves illustrating the operation of the device of FIG. 4.

Figure 1A:
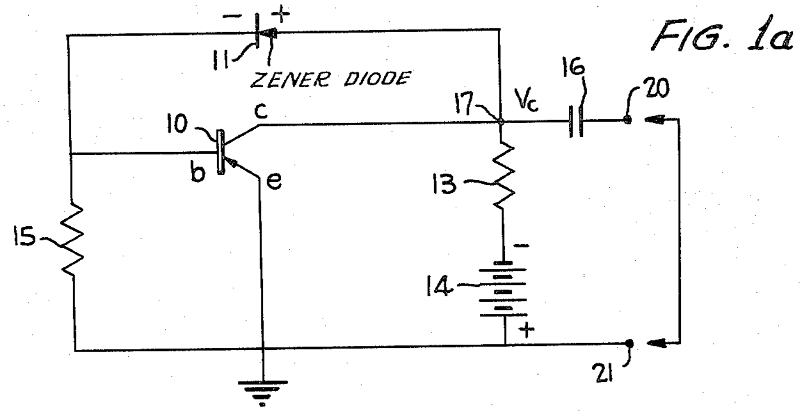
Figure 6:
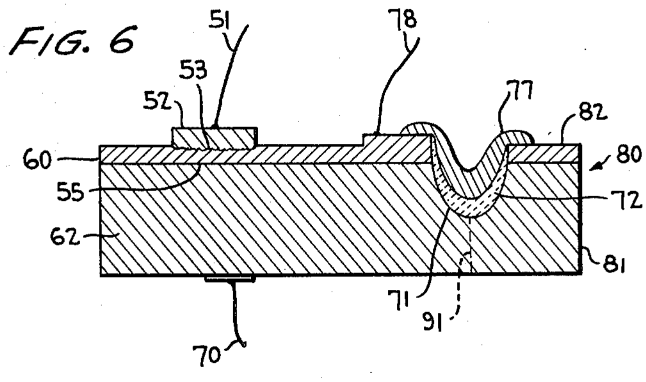

FIG. 6 is a cross-sectional view of a solid state device incorporating in one unit all of the active devices found in the circuits of FIGS. 1*a* or 4.

In the drawings, similar elements are referred to by similar reference numbers.

Referring now to FIG. 1*a*, there is shown one of the simplest forms of a circuit constructed according to the present invention. The circuit consists of a transistor 10 which may be any type of commonly used transistor. The transistor used in this circuit is of the p-n-p type. This transistor is connected in the circuit with its emitter *e* grounded so that the transistor functions as a current amplifier. A diode 11 is connected between the base *b* and collector *c* of the transistor 10. The diode 11 is poled so that its reverse impedance is in a direction from the collector *c* to the base *b* of the transistor 10. The diode 11 is of the type having a dielectric which will break down when a voltage applied in the reverse direction exceeds a fixed value. When the breakdown occurs, the diode becomes highly conductive in the negative direction due to the fact that an avalanche of charge is produced in a process of ionization by collision. The diode used in the further embodiment of this invention is further characterized by having a noisy characteristic in a region immediately following the breakdown point. Certain types of silicon alloy junction diodes have been found to exhibit these properties; particularly, diodes from the TI 614 series have been used successfully. An input resistor 15 is provided between the base *b* and the emitter *e* of transistor 10, and is of a relatively large value compared to the base-to-emitter resistance. This resistor 15 serves primarily to adjust the level of input current to the transistor 10. A second resistance, load resistor 13, is provided between the collector *c* of transistor 10 and the negative terminal of power supply 14. The positive terminal of power supply 14 is connected to ground. A D.C. blocking capacitor 16 is also connected to the collector *c* of transistor 10 and serves to effectively permit only the relatively high frequency noise signals to be conducted to the output terminals 20 and 21.

Figures 1B, 2A, 2B:
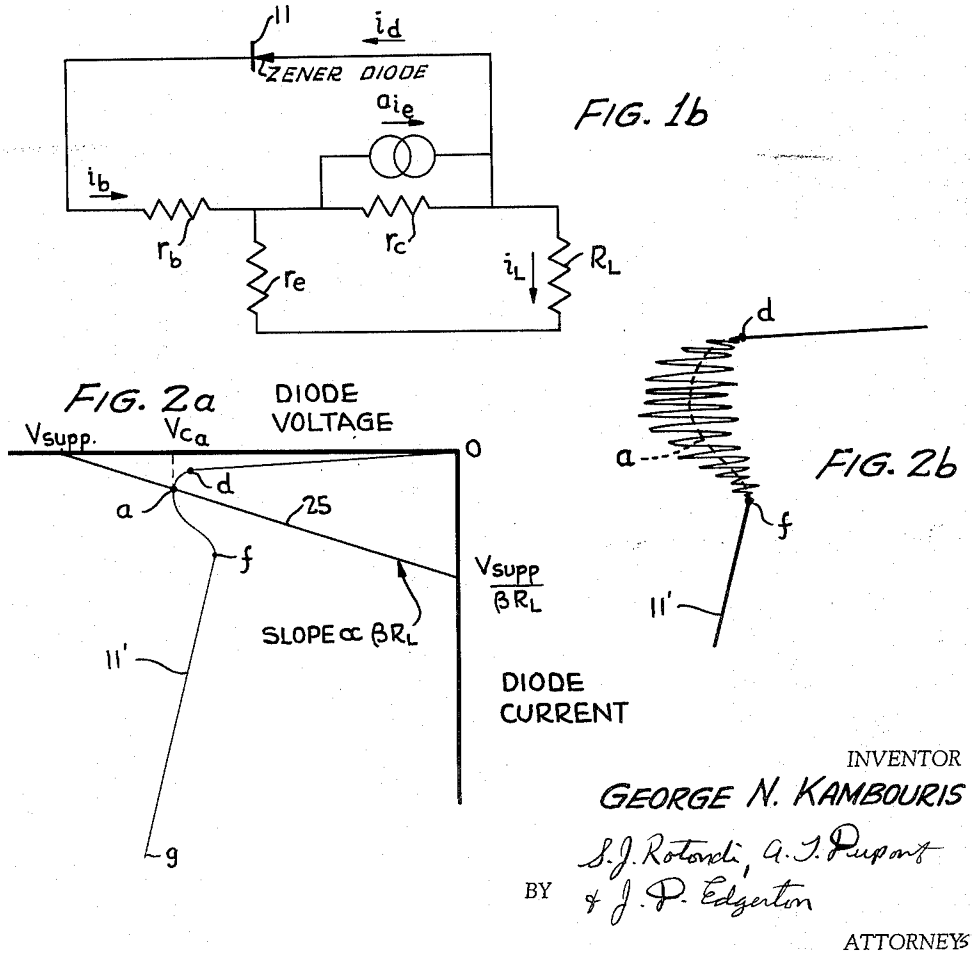

The operation of the circuit of FIG. 1 can best be explained by reference to the graphs of FIGS. 2*a* and 2*b*. In FIG. 2*a* there is shown a voltage versus current curve 11′ representing the reverse characteristic of the diode 11. The portion of the characteristic 11′ from the points *o* to *d* represents the normal reverse impedance characteristic of the diode before breakdown occurs. During this portion of the characteristic the impedance of the diode to reverse current flow is extremely high and a negligible amount of current flows. The region represented by the portion *d–a–f* of curve 11′ represents the initial portion of the breakdown phenomenon. Although this portion is shown as a continuous smooth line in FIG. 2*a*, it is actually a region of high instability in a diode of the type used in this circuit and has a voltage versus current waveform comparable to that shown in FIG. 2*b*. The waveform shown in FIG. 2*b* is not intended to be an accurate reproduction of the waveform appearing in the region *d–a–f* since the high noise frequency, being in the 250-kilocycle range, cannot be accurately drawn to scale. Therefore, the waveform shown in FIG. 2*b* is merely intended to be illustrative of the waveform in this region. The portion of the curve 11′ from the point *f* to *g* represents the high conduction region of the diode after it has passed through the noisy region. Neither the low conduction region, nor the high conduction region *fg*, of the diode exhibit any noticeable noise characteristic.

In the circuit of FIG. 1*a* the diode 11 is connected to the base of transistor 10 in such a manner that when reverse current is flowing through the diode it flows into the base of transistor 10. The transistor 10 also has an input resistor 15 connected between its base and emitter, which resistor is of a relatively high value, so that substantially all of the current through the diode flows to the transistor base. The point *a* on the curve 11′ of FIG. 2*a* represents the point of maximum noise level of the diode. Therefore, if the diode can be made to operate near the point *a* the current output from the collector *c* of transistor 10 will be a noise signal of large amplitude. In order to accomplish the desired operation, it is only necessary to adjust the parameters of the circuit so that the voltage and impedance across the diode 11 are represented by the load line, such as the line 25 in FIG. 2*a*, which passes through the point *a* on the curve 11'. Since the base-to-emitter resistance of the transistor 10 is of a relatively small value compared to the reverse impedance of diode 11, the voltage across the diode may be considered to be equal to the voltage $V_c$ appearing at terminal 17 of the circuit. By following well known design procedures, it is possible to select the current values necessary to arrive at a load line for the diode which passes through the point *a* on the curve 11'. With such a load line, the diode will operate in its noisy region *df* without any external control. The determination of the value of load resistor 13 needed to derive the desired load line 25 of FIG. 2*a* may be determined from the circuit of FIG. 1*b* which represents an equivalent circuit of FIG. 1*a*. In FIG. 1*b*, the current directions shown refer to electron currents. The sign convention for electron current flow will be followed throughout this application. The resistances $r_b$, $r_e$, and $r_c$, and the current source $ai_e$ represent the T equivalent circuit of the transistor 10 of FIG. 1*a*. The resistance $R_L$ represents the resistor 13 of FIG. 1*a*, and the diode 11 represents its similar component of FIG. 1*a*. The input resistor 15 of FIG. 1*a* is not shown in FIG. 1*b* because it is of such a large value with comparison to the series connection of $r_b$ and $r_e$ that it may be neglected. Likewise, the capacitor 16 of FIG. 1*a* is not included since FIG. 1*b* represents the equivalent circuit of FIG. 1*a* with terminals 20 and 21 open-circuited. The resistance, $r_c$, of FIG. 1*b* is very large, of the order of one megohm, and may therefore be considered to be drawing very little current. Since the reverse impedance of diode 11 is large with respect to series connection of $r_b$ and $r_e$, it may be assumed that the voltage appearing across load resistor $R_L$ is equal to the voltage appearing across the diode 11. This voltage will be referred to as $V_0$. From these assumptions and from the equivalent circuit of FIG. 1*b*, it may be seen that $$i_d = i_b \quad (1)$$

$$\Delta V_0 = \Delta i_L R_L \quad (2)$$

where $\Delta V_0$ represents an incremental change in the voltage $V_0$, and $\Delta i_L$ equals a corresponding incremental change in the current through load resistor $R_L$. Further, $$i_d = V_0 / Z_{in} \quad (3)$$

where $Z_{in}$ represents the impedance seen across the terminals of diode 11. From Equations 1, 2, and 3, it may be seen that $$\Delta i_d \times Z_{in} = \Delta V_0 = \Delta i_b Z_{in} = \Delta i_L R_L \quad (4)$$

Thus $$Z_{in} / R_L = \Delta i_L / \Delta i_b = \beta \quad (5)$$

where $\beta$ represents the base-to-collector current gain of the transistor in its grounded emitter configuration. Therefore, $$Z_{in} = R_L \times \beta \quad (6)$$

Since $Z_{in}$ represents the load impedance seen across diode 11, the slope of the load line 25 in FIG. 2*a* will be equal to the inverse of $Z_{in}$. Therefore, once the desired slope is determined, it is only necessary to divide $Z_{in}$ by B in order to determine the value of $R_L$ needed to achieve this load line.

Figures 2C, 3:
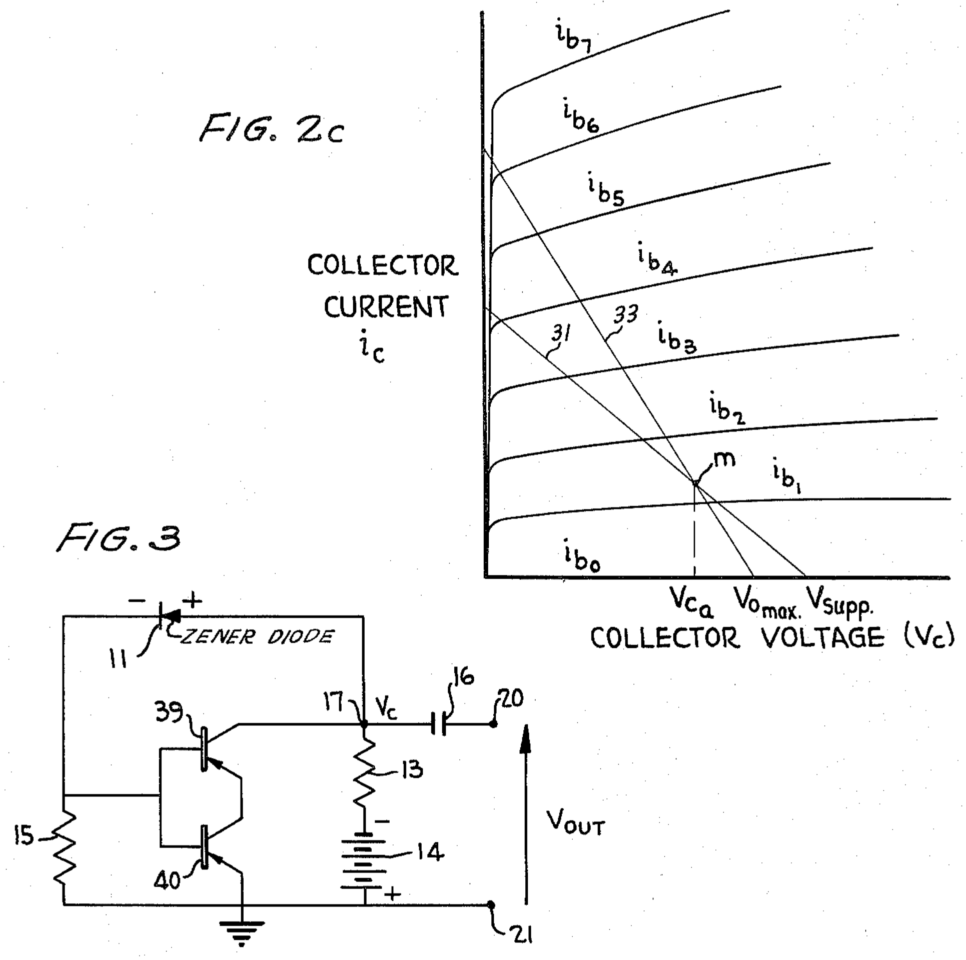
FIG. 3 is a schematic diagram of a modification of the device shown in FIG. 1*a*.

Referring now to FIG. 2*c*, there is shown a family of curves representing the transistor collector characteristics for various values of base current. From the values of the circuit parameters of the circuit of FIG. 1*b*, a D.C. load line 31 may be constructed on this curve. The point *m* on this load line represents the voltage $V_{ca}$ appearing at the point *a* in FIG. 2*a*. When terminals 20 and 21 of the circuit of FIG. 1*a* are open circuited, and neglecting various distributed reactive parameters of the transistor 10, it is theoretically possible for the voltage output at terminal 20 to go from the supply voltage to 0. When some output impedance is placed across the terminals 20 and 21, the A.C. loadline of transistor 10 becomes the line shown as line 33 in FIG. 2*c*, and the maximum output voltage swing of the circuit decreases slightly. The capacitor 16 of FIG. 1*a* serves as a D.C. blocking capacitor and permits only the higher frequency noise signals produced by the circuit to be conducted to output terminal 20.

It is of course necessary, in order for the circuit of FIG. 1*a* to operate properly, that the diode 11 break down before the transistor 10 does so. While it is possible to obtain diodes and transistors having this relationship, it may be desirable to utilize transistors having a breakdown voltage which is lower than that of the diode. If this is the case, it is possible to modify the circuit of FIG. 1*a* in the manner shown in FIG. 3, where two transistors 39 and 40 are connected in place of the one transistor used in FIG. 1*a*. In FIG. 3, transistors 39 and 40 are connected with their bases in parallel and with their collector-emitter circuits connected in series. In this arrangement the base of each transistor receives only one half of the current passing through the diode 11. This circuit operates in substantially the same manner as the circuit of FIG. 1*a*, and all of the components of this circuit perform the same functions as the components having similar reference numbers in FIG. 1*a*.

Another form which this invention might take is shown in FIG. 4 wherein the amplifier of FIG. 1*a* is modified by the incorporation therein of a feedback impedance 24 in parallel with the diode 11. In this circuit the current amplification properties of the grounded emitter transistor configuration are utilized to obtain an oscillator circuit. In this embodiment, either the base input impedance 15, the collector output impedance 13, or the feedback impedance 24 may be converted to a tuned resonant circuit or to a passive delay circuit in order to permit the circuit of FIG. 4 to be self oscillatory. The techniques by which the basic transistor amplifier can be converted to an oscillator are well known in the art and are fully described in electronic and Radio Engineering, fourth edition, 1955, by Terman, at page 795 and in Applied Electronics, second edition, 1954, by Gray, at pages 725 and 726. Therefore, it does not appear necessary to present a detailed description of the operation of such a basic oscillator here.

In the embodiment of FIG. 4, the diode 11 is connected, as in the embodiments shown in FIGS. 1*a* and 3, so that the voltage appearing at terminal 17 of the circuit will cause current to flow through the diode in the negative direction. The components of the oscillator circuit are selected so that the peak voltage appearing at terminal 17 is slightly greater than the diode reverse breakdown voltage. The resulting voltage appearing across output terminals 20 and 21 is shown in FIG. 5*a*. From the graph of 5*a* it may be seen that the output waveform is a combination of a sinusoidal waveform created by the oscillator and a noise voltage due to the diode breakdown. The noise voltage occurs during those time intervals when the output sinusoidal voltage has an amplitude in the diode noise region indicated in FIG. 2*a* as the portion *d–a–f* of the diode characteristic curve 11'. The output voltage appearing across terminals 20 and 21 of the oscillator of FIG. 4 may be suitably filtered by a high pass filter 27 in order to eliminate the sinusoidal voltage produced by the oscillator. The resultant output across terminals 28 and 29 will then be a series of noise pulses having a repetition rate equal to the frequency of the transistor oscillator.

FIG. 6 illustrates a unitary semiconductor device capable of functioning as a combination avalanche diode and transistor. The use of such a component greatly facilitates the construction of circuits used in the practice of this invention since it incorporates in one unit all of the semiconductor components needed for the operation of these circuits. In order to construct this unit a relatively large wafer of positive semiconductor material 62 is joined with a thinner wafer of negative semiconductor material 60 and 82. A smaller layer of positive semiconductor material 52 is then deposited on the wafer 60. A portion of the material is then etched away in the region 71 and a layer of insulating material 72 is deposited thereon. The purpose of this operation is to divide the negative semiconductor layer into two distinct segments. A layer of conducting material 77 is then deposited over both the layer of insulating material 72 and the regions of semiconductor material 60 and 82 adjacent to the insulating material. The purpose of this layer of conducting material is to create a good electrical connection between the two negative semiconductor portions. Leads 51, 70 and 78 are then joined to semiconductor regions 52, 62, and 60, respectively, in order to provide electrical connection with other circuit elements. When completed, the unit comprises a transistor having a base region 60, a collector region 62 and an emitter region 52 appearing to the left of dividing line 91, and an avalanche diode 80 comprising a cathode 82 and a plate 81 to the right of dividing line 91. The units are permanently connected with the diode plate 81 connected to the transistor collector 62 at junction 91 and the diode cathode 82 connected to transistor base 60.

It will be apparent that the embodiments shown are only exemplary and that various modifications can be made in construction and arrangement within the scope of the invention as defined in the appended claim.

I claim as my invention:

A pulse noise generator comprising:

(a) a transistor having a base electrode, a collector electrode, and an emitter electrode;

(b) an input impedance connected between said base electrode and said emitter electrode;

(c) a first feedback circuit connected between said collector electrode and said base electrode and providing regenerative feedback from said collector electrode to said base electrode to make said transistor self-oscillatory;

(d) a second feedback circuit consisting of a Zener diode connected between said collector electrode and said base electrode and poled so that the collector-to-base voltage of said transistor produces a current though said Zener diode in its reverse direction, said Zener diode having a noisy characteristic in a region immediately following its breakdown point;

(e) a load impedance;

(f) a power supply, said load impedance and said power supply being connected in series between said collector electrode and said emitter electrode, said load impedance, said input impedance, and said first feedback circuit having values which establishes the peak collector voltage of said transistor at a value approximately equal to the breakdown voltage of said Zener diode whereby the collector voltage of said transistor varies sinusoidally with a period determined by said load impedance, said input impedance, and said first feedback circuit, and the peaks of the collector voltage waveform have superimposed thereon the amplified noise signal produced by said Zener diode; and (g) filter means connected between said collector electrode and said emitter electrode for passing only the noise signal appearing at said collector electrode thereby providing as an output signal a series of noise pulses having a repetition rate equal to the frequency of the sinusoidal waveform of the collector voltage of said transistor.

References Cited by the Examiner

UNITED STATES PATENTS

| | | | |
|---|---|---|---|
| 2,773,186 | 12/56 | Herrmann | 331—78 X |
| 2,941,160 | 6/60 | Blake et al. | 331—183 X |
| 2,981,898 | 4/61 | St. John | 331—78 X |
| 3,021,451 | 2/62 | Lundahl | 331—109 X |
| 3,094,675 | 6/63 | Uhle | 307—88.5 X |
| 3,144,619 | 8/64 | Cochran | 331—109 |
| 3,164,783 | 1/65 | Houpt | 331—109 |
| 3,165,707 | 1/65 | Clapper | 331—78 |

FOREIGN PATENTS

| | | |
|---|---|---|
| 817,319 | 7/59 | Great Britain. |

ROY LAKE, *Primary Examiner.*

JOHN KOMINSKI, *Examiner.*